(12) United States Patent
Clarke et al.

(10) Patent No.: US 11,817,521 B2
(45) Date of Patent: Nov. 14, 2023

(54) ELECTRICAL CONTACT FABRICATION

(71) Applicant: Raytheon Company, Waltham, MA (US)

(72) Inventors: Andrew Clarke, Santa Barbara, CA (US); David R. Rhiger, Santa Barbara, CA (US); Chad W. Fulk, Santa Barbara, CA (US); Stuart B. Farrell, Santa Barbara, CA (US); James Pattison, Santa Barbara, CA (US); Jeffrey M. Peterson, Santa Barbara, CA (US); Chad M. Althouse, Lompoc, CA (US)

(73) Assignee: Raytheon Company, Waltham, MA (US)

(*) Notice: Subject to any disclaimer, the term of this patent is extended or adjusted under 35 U.S.C. 154(b) by 146 days.

(21) Appl. No.: 17/475,962

(22) Filed: Sep. 15, 2021

(65) Prior Publication Data

US 2023/0082114 A1     Mar. 16, 2023

(51) Int. Cl.
*H01L 31/18* (2006.01)
*H01L 31/0224* (2006.01)
*H01L 31/0296* (2006.01)

(52) U.S. Cl.
CPC .... *H01L 31/1832* (2013.01); *H01L 31/02966* (2013.01); *H01L 31/022408* (2013.01); *H01L 31/1864* (2013.01)

(58) Field of Classification Search
CPC ............ H01L 31/1832; H01L 31/02966
See application file for complete search history.

(56) References Cited

U.S. PATENT DOCUMENTS

| 3,458,778 A | 7/1969 | Genzabella et al. |
| 3,617,824 A | 11/1971 | Shinoda et al. |

(Continued)

FOREIGN PATENT DOCUMENTS

EP     0042218     * 6/1981

OTHER PUBLICATIONS

Dahal et al., "Metallic Nickel Silicides: Experiments and Theory for NiSi and First Principles Calculations for Other Phases," Journal of Alloys and Compounds, vol. 672; Feb. 17, 2016; 7 Pages.

(Continued)

*Primary Examiner* — Matthew L Reames
(74) *Attorney, Agent, or Firm* — DALY CROWLEY MOFFORD & DURKEE, LLP (57) ABSTRACT

In one aspect, a method includes forming an electrical path between p-type mercury cadmium telluride and a metal layer. The forming of the electrical path includes depositing a layer of polycrystalline p-type silicon directly on to the p-type mercury cadmium telluride and forming the metal layer on the layer of polycrystalline p-type silicon. In another aspect, an apparatus includes an electrical path. The electrical path includes a p-type mercury cadmium telluride layer, a polycrystalline p-type silicon layer in direct contact with the p-type mercury cadmium telluride layer, a metal silicide in direct contact with the polycrystalline p-type silicon layer, and an electrically conductive metal on the metal silicide. In operation, holes, indicative of electrical current on the electrical path, flow from the p-type mercury cadmium telluride layer to the electrically conductive metal.

20 Claims, 6 Drawing Sheets

(56) References Cited

U.S. PATENT DOCUMENTS

| | | | |
|---|---|---|---|
| 6,172,382 B1* | 1/2001 | Nagahama | H01L 33/32 257/97 |
| 7,432,180 B2 | 10/2008 | Uchino et al. | |
| 2014/0084241 A1* | 3/2014 | Okuno | H01L 33/06 438/47 |
| 2015/0083993 A1* | 3/2015 | Nagata | H01L 33/06 257/13 |

OTHER PUBLICATIONS

Eadi et al., "Nickel Film Deposition with Varying RF Power for the Reduction of Contact Resistance in NiSi," Article in *Coatings*, vol. 9, No. 349; Published May 28, 2019; 9 Pages.

Foggiato et al., "Optimizing the Formation of Nickel Silicide," Materials Science and Engineering: B, vols. 114-115; Dec. 2004; 17 Pages.

Sinha et al., "Tuning the Schottky Barrier Height of Nickel Silicide on p-silicon by Aluminum Segregation," Applied Physics Letters, vol. 92, No. 22; Jun. 2008; 3 Pages.

Tuya et al., "Formation Temperature Dependence of Thermal Stability of Nickel Silicide with Ni—V Alloy for Nanoscale MOSFETs," Proceedings of the IEEK; Published Nov. 26, 2005; 4 Pages.

Zhong et al., "Study of Thermal Stability of Nickel Silicide using Ni—V Alloy," Transactions on Electrical and Electronic Materials, vol. 9, No. 2; Apr. 2008; 5 Pages.

\* cited by examiner

ELECTRICAL CONTACT FABRICATION

FIELD OF THE DISCLOSURE

The present disclosure relates to semiconductor device fabrication, and more particularly to fabricating an electric contact to a semiconductor device.

BACKGROUND

Infrared detectors may be, for example, silicon-based, or mercury-cadmium-telluride-based devices. For silicon-based infrared detectors, traditional techniques in fabricating an electrical contact to p-type silicon theoretically requires a metal with a higher work function than the p-type silicon, which is typically in the range of 4.9 eV. A standard contact metal for a silicon-based infrared detectors is titanium tungsten, which has a lower work function than p-type silicon and results in high contact resistance in the range of $2 \times 10^{-2}$ Ohms-cm$^2$ after an anneal, but twice the contact resistance before the anneal. High contact resistance is known to generate a thermal contribution to noise (Johnson-Nyquist Noise), which may degrade the performance of an infrared detector.

For mercury-cadmium-telluride-based infrared detectors, electrical contact to p-type mercury cadmium telluride (MCT) is normally made using gold. Although gold may have a lower work function than MCT, gold diffusion into the contact interface serves to increase the p-type doping concentration in the MCT close to the interface, because gold is a p-type dopant for MCT. This increase in doping concentration serves to decrease the junction's depletion width and make it a low-resistance tunneling junction. In fabricating an MCT infrared detector using gold, an issue of gold contamination on tools shared with silicon-based infrared detector fabrication arises. It is difficult to fabricate a good Ohmic contact to p-type MCT as is well known in the art as many direct metal contacts have been tried. Due to the complex thermodynamics of (p-type) mercury cadmium telluride with various metals, interdiffusion, alloy formation, diode spiking, and unintended doping have led to rectifying Schottky barriers in almost all cases except for gold and tin/gold. Gold is known in the art to be a fast diffuser that disrupts silicon-based devices. Furthermore, gold is difficult and sometimes impossible to decontaminate from many types of fabrication tools once gold has contaminated these fabrication tools. Thus, eliminating gold from the process is a way to take advantage of sharing expensive fabrication equipment needed to fabricate infrared devices that are silicon-based and mercury-cadmium-telluride-based.

SUMMARY

In one aspect, a method includes forming an electrical path between p-type mercury cadmium telluride and a metal layer. The forming of the electrical path includes depositing a layer of polycrystalline p-type silicon directly on to the p-type mercury cadmium telluride and forming the metal layer on the layer of polycrystalline p-type silicon.

In another aspect, an apparatus includes an electrical path. The electrical path includes a p-type mercury cadmium telluride layer, a polycrystalline p-type silicon layer in direct contact with the p-type mercury cadmium telluride layer, a metal silicide in direct contact with the polycrystalline p-type silicon layer, and an electrically conductive metal on the metal silicide. In operation, holes, indicative of electrical current on the electrical path, flow from the p-type mercury cadmium telluride layer to the electrically conductive metal.

In a further aspect, a method includes forming an electrical path between a first semiconductor of a first doping type and a first conductor. Forming the electrical path includes forming a layer of a second semiconductor of the first doping type onto the first semiconductor and forming a layer of the first conductor on the second semiconductor.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Described herein are techniques to fabricate an electrical contact that has a low resistance typically in the range of $2 \times 10^{-4}$ to $2 \times 10^{-6}$ Ohms-cm$^2$. In one example, the electrical contact may be gold-free. The techniques described herein may be used to form an electrical contact with a p-type semiconductor, which is a near-Ohmic low-resistance contact to a p-type semiconductor in its as-deposited state before annealing, and which the electrical contact becomes a pure Ohmic low-resistance contact after annealing.

Figure 1:
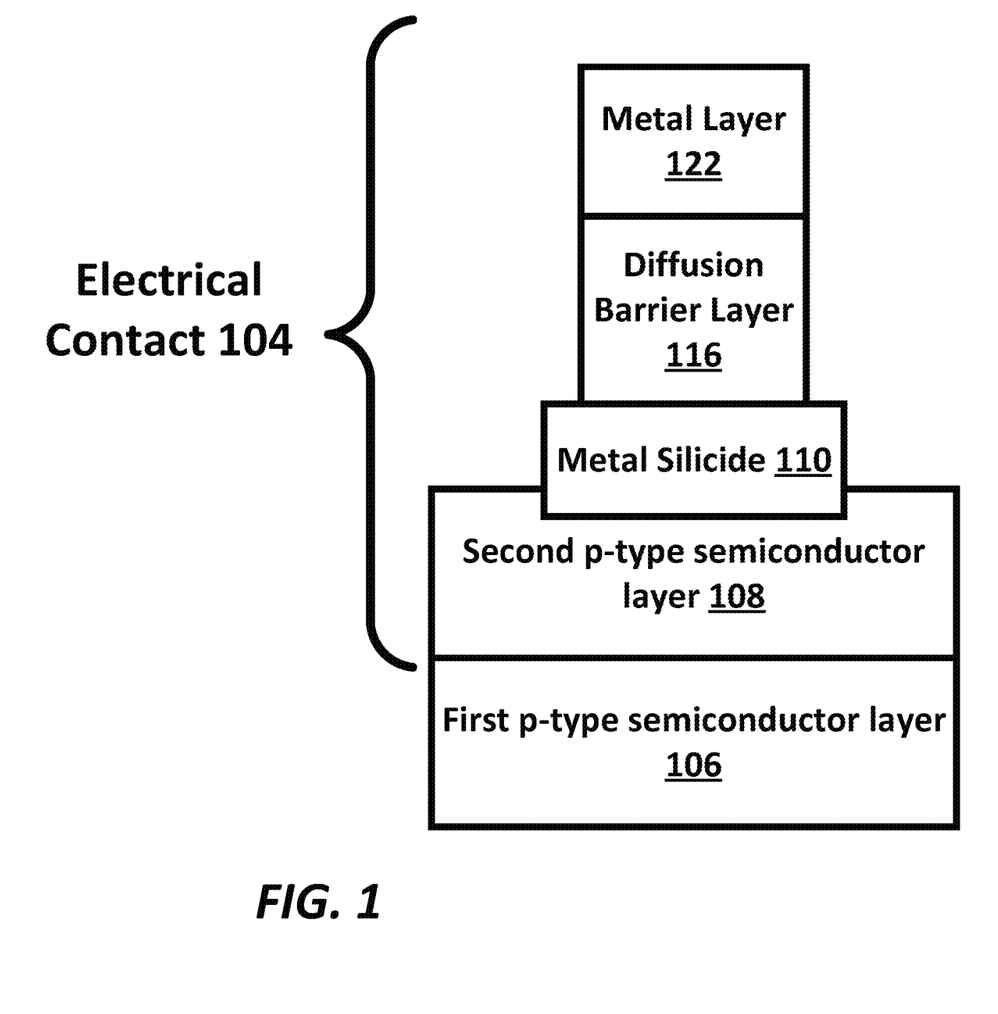
FIG. 1 is a diagram of an example of an electrical contact.

Referring to FIG. 1, a first p-type semiconductor 106 is accessed by an electrical contact 104. In one example, the first p-type semiconductor 106 is p-type mercury cadmium telluride. In one example, the first p-type semiconductor 106 is doped with arsenic (As). In one example, the doping of arsenic is about 12 parts per million (ppm) or about $5 \times 10^{17}$ As atoms/cm$^3$ within plus or minus $1 \times 10^{17}$ As atoms/cm$^3$.

In one example, the electrical contact 104 may include a second p-type semiconductor layer 108, which is in direct contact with the first p-type semiconductor 106. In one example, the electrical contact 104 may be gold-free.

In one example, the second p-type semiconductor 106 is p-type polysilicon. In one example, the second p-type semiconductor 106 is doped with boron (B). In one particular example, the boron doping is about 65 ppm or about $3 \times 10^{18}$ B atoms/cm$^3$ within plus or minus $1 \times 10^{18}$ B atoms/cm$^3$.

The electrical contact 104 may also include a metal silicide 110 in direct contact with the second p-type semiconductor 106. In one example, the metal silicide 110 may be a nickel silicide formed by the reaction of nickel with the second p-type semiconductor. In other examples, the metal silicide 110 may include a nickel alloy, or any other combination of metals that are used to form a metal silicide, such as tantalum, titanium, platinum, palladium, gadolinium, and terbium.

The electrical contact 104 may further include a diffusion barrier layer 116 in direct contact with the metal silicide 110. In one example, the diffusion barrier layer 116 is configured to be a barrier to oxygen permeation and metal diffusion.

In one example, the diffusion barrier layer 116 may be a metal or a metal alloy. In one particular example, the diffusion barrier layer 116 may be formed from any refractory metal or refractory metal nitride. For example, tungsten, titanium, tungsten-titanium, and their nitrides may be used to form the diffusion barrier layer 116. In another example, the diffusion barrier layer 116 may include tantalum, vanadium, ruthenium, rhenium, molybdenum, chromium, zirconium, niobium, rhodium, hafnium, rhenium, osmium, iridium, technetium, their alloys, and their nitrides. In yet another example, the diffusion barrier layer 116 may be formed from a conductive metal oxide. For example, the oxides of indium, rhenium, and tin may be used to form the diffusion barrier layer 116.

The electrical contact 104 may further include a metal layer 122 in direct contact with the diffusion barrier layer 116. In one example, the metal layer 122 may include aluminum or an aluminum alloy. In another example, the metal layer 122 may include copper or gold. In one particular example, the metal contact 122 may include an identical material as the diffusion layer barrier 116.

The electrical contact 104 may form an electrical path with the first p-type semiconductor 106. For example, in operation with other components the electrical path allows current (in this example, as holes) to flow from the first p-type semiconductor 106 to the metal layer 122.

Figure 2:
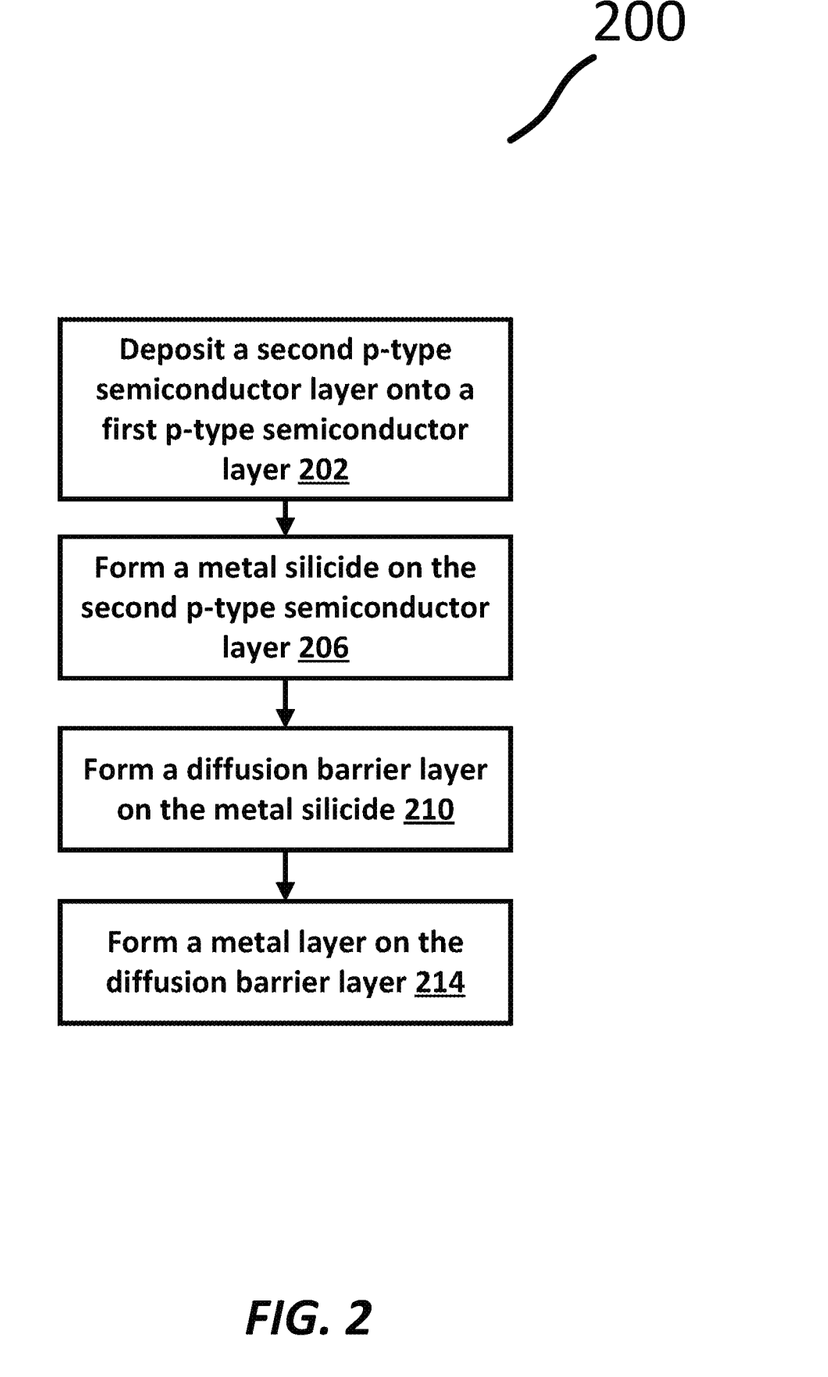
FIG. 2 is a flowchart of an example of a process to fabricate the electrical contact of FIG. 1.

Referring to FIG. 2, an example of a process to form the electrical contact 104 (FIG. 1) is a process 200. Process 200 deposits a second p-type semiconductor layer onto a first type p-type semiconductor layer. For example, the second p-type semiconductor layer 108 is deposited directly on to the first p-type semiconductor layer 106 (FIG. 1) using sputtering techniques.

Process 200 forms a metal silicide on the second p-type semiconductor layer (206). For example, the metal silicide 110 is formed directly on to the second p-type semiconductor layer 108 (FIG. 1).

Process 200 forms a diffusion barrier layer on the metal silicide (210). For example, the diffusion barrier layer 116 is deposited directly on to the metal silicide 110 (FIG. 1).

Process 200 forms a metal layer on the diffusion barrier layer (214). For example, the metal layer 122 is deposited directly on to the diffusion barrier layer 116 (FIG. 1).

Figure 3:
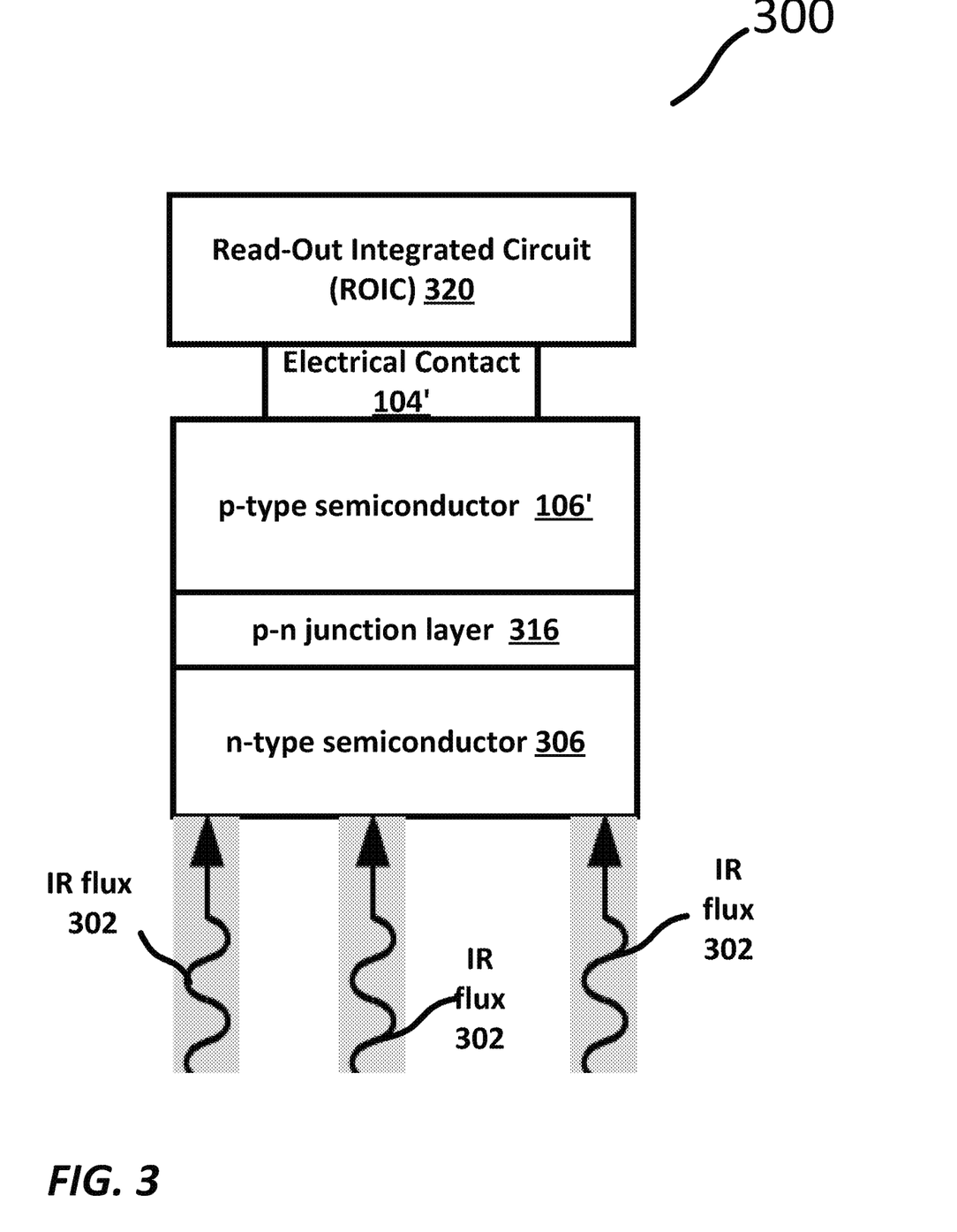
FIG. 3 is a diagram of an example of a portion of an infrared detector.

Referring to FIG. 3, an example of a portion of an infrared detector is an infrared detector portion 300. The infrared detector portion 300 is an example of a single pixel. The infrared detector portion 300 includes a n-type semiconductor 306, a p-n-junction layer 316, a p-type semiconductor 106' and electrical contact 104' and a read-out integrated circuit (ROIC) 320.

The p-type semiconductor 106' is an example of the p-type semiconductor layer 106 (FIG. 1). The electrical contact 104' is an example of the electrical contact 104 (FIG. 1).

In operation, an infrared flux 302 containing photons is received by the n-type semiconductor 306. Holes are formed in the p-n junction layer 316 and form a current that is passed through the p-type semiconductor 106' and through the contact 104' to a corresponding connector on the ROIC 320, where each connector on the ROIC corresponds to a single pixel.

Figure 4A:
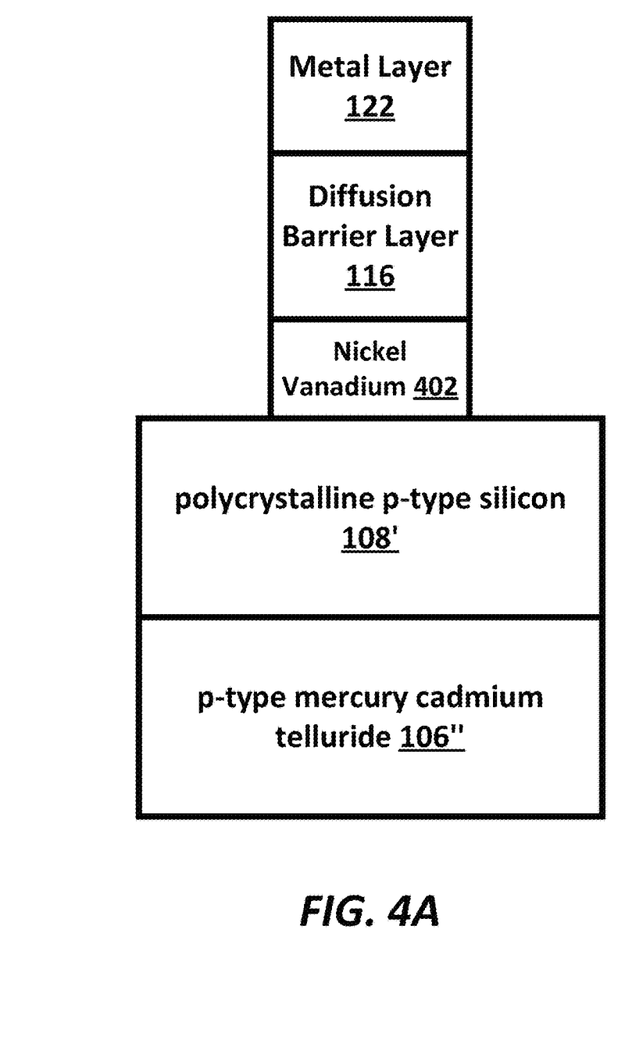
FIG. 4A is a diagram of another example of an electrical contact with a nickel vanadium layer before annealing.
Figure 4B:
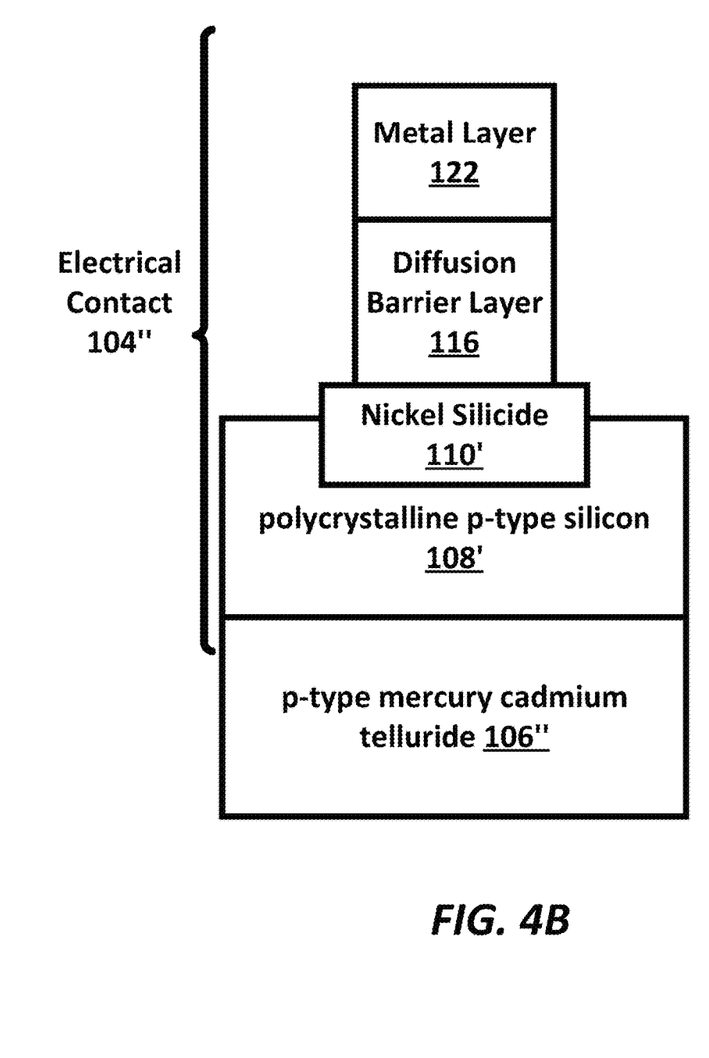
FIG. 4B is a diagram of the electrical contact of FIG. 4A after annealing.

Referring to FIGS. 4A and 4B, an electrical contact may be formed by using an annealing process to form a metal silicide 110 (FIG. 1). Prior to annealing, a polycrystalline p-type silicon 108' is directly on p-type mercury cadmium telluride 106".

The p-type mercury cadmium telluride 106" is an example, of the first p-type semiconductor layer 106 (FIG. 1). The polycrystalline p-type silicon 108' is an example of the second p-type semiconductor layer 108 (FIG. 1). In one example, the polycrystalline p-type silicon has a boron atom density greater than $1 \times 10^{18}$ B atoms per cm$^3$.

A nickel vanadium layer 402 is deposited directly on the p-type polysilicon 108' and the diffusion barrier layer 116 is directly deposited on the nickel vanadium layer 402. The metal layer 122 is deposited on the diffusion barrier layer 116. In one example, the nickel vanadium is between 3 to 20% by weight of vanadium.

During annealing, the nickel vanadium 402 is consumed through chemical reactions by the p-type polysilicon 108' to form nickel silicide 110'. Thus, what remains is an electrical contact 104", which includes the nickel silicide 110' in direct contact with the p-type polysilicon 108', the nickel silicide 110' is in direct contact with the diffusion barrier layer 116 and the metal layer 122 is in direct contact with the diffusion barrier layer 116.

The nickel silicide 110' may have vanadium atoms disposed between interstitial sites of nickel and silicon atoms. The nickel silicide 110' includes nickel and silicon atoms in about a one-to-one atomic ratio. In one example, a thickness of the nickel vanadium 402 is selected based on a thickness of the polycrystalline p-type silicon, so that a portion of the polycrystalline p-type silicon 108' will remain after annealing between the nickel silicide 110' and the p-type mercury cadmium telluride 106".

Figure 5:
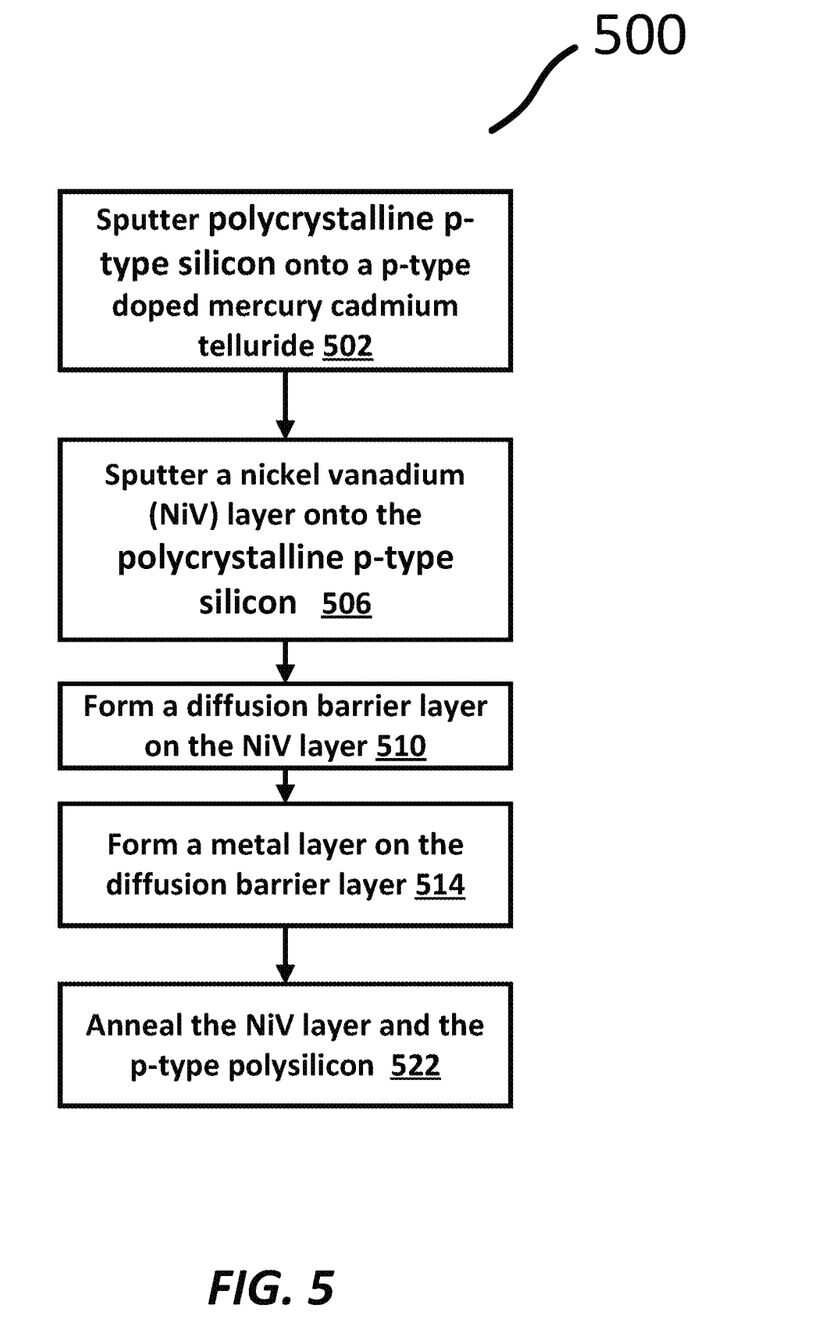
FIG. 5 is a flowchart of an example of a process to fabricate the electrical contact of FIG. 4B.

Referring to FIG. 5, an example of a process to fabricate the electrical contact 104" (FIG. 4B is a process 500. Process 500 sputters polycrystalline p-type silicon onto a p-type doped mercury cadmium telluride (502). For example, the polycrystalline p-type silicon 108' is sputtered on to the p-type doped mercury cadmium telluride (FIG. 4A).

Process 500 sputters a nickel vanadium layer on to the polycrystalline p-type silicon (506). For example, the nickel vanadium 402 is sputtered directly on to the polycrystalline p-type silicon 108' (FIG. 4A). In one example, the nickel vanadium 402 is deposited to a thickness that is about one-half to one-eighth the thickness of the polycrystalline p-type silicon 108'.

Process 500 forms a diffusion barrier layer on the nickel vanadium layer (510). For example, the diffusion layer 116 is deposited directly on to the nickel vanadium 402 (FIG. 4A).

Process 500 forms a metal layer on the diffusion barrier layer (514). For example, the metal layer 122 is deposited directly on to the diffusion barrier layer 116 (FIG. 4A).

Process 500 anneals the nickel vanadium layer and the polycrystalline p-type silicon (522). For example, the nickel vanadium 402 and the polycrystalline p-type silicon 108' are heated to 350° C. for at least 30 minutes in nitrogen. In some examples, the nickel vanadium 402 and the polycrystalline p-type silicon 108' are heated to 350° C. for at least 2 hours in nitrogen.

Figure 6A:
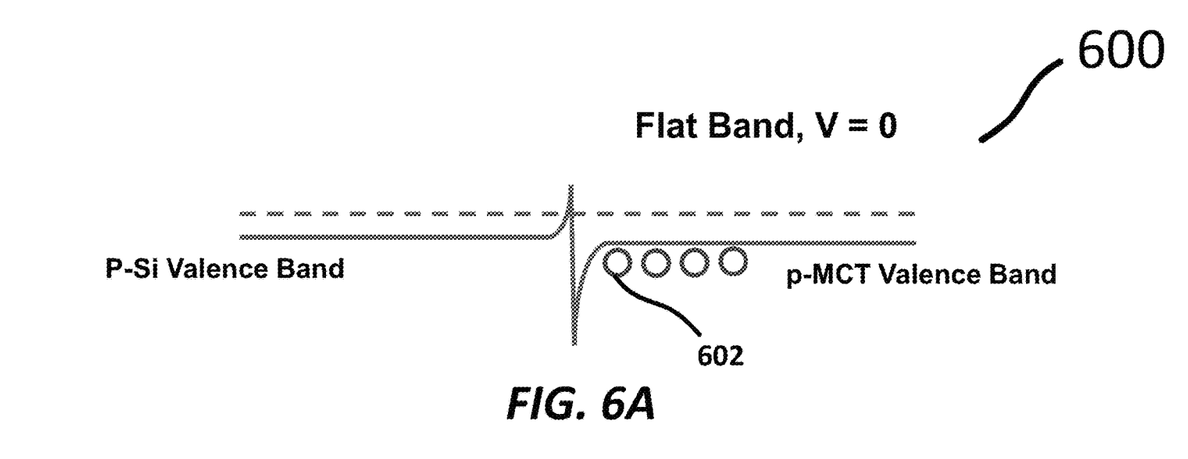
FIG. 6A is a diagram of an example of the valence energy bands of p-type mercury cadmium telluride (MCT) and polycrystalline p-type silicon (p-Si) junction for a flat band (e.g., voltage is zero)

Referring to FIG. 6A, a diagram 600 depicts the valence energy bands of p-type mercury cadmium telluride (p-MCT) and the polycrystalline p-type silicon (p-Si) at a flat band (no voltage is applied externally across the junction) with the majority carrier depicted by holes (e.g., a hole 602).

Figure 6B:
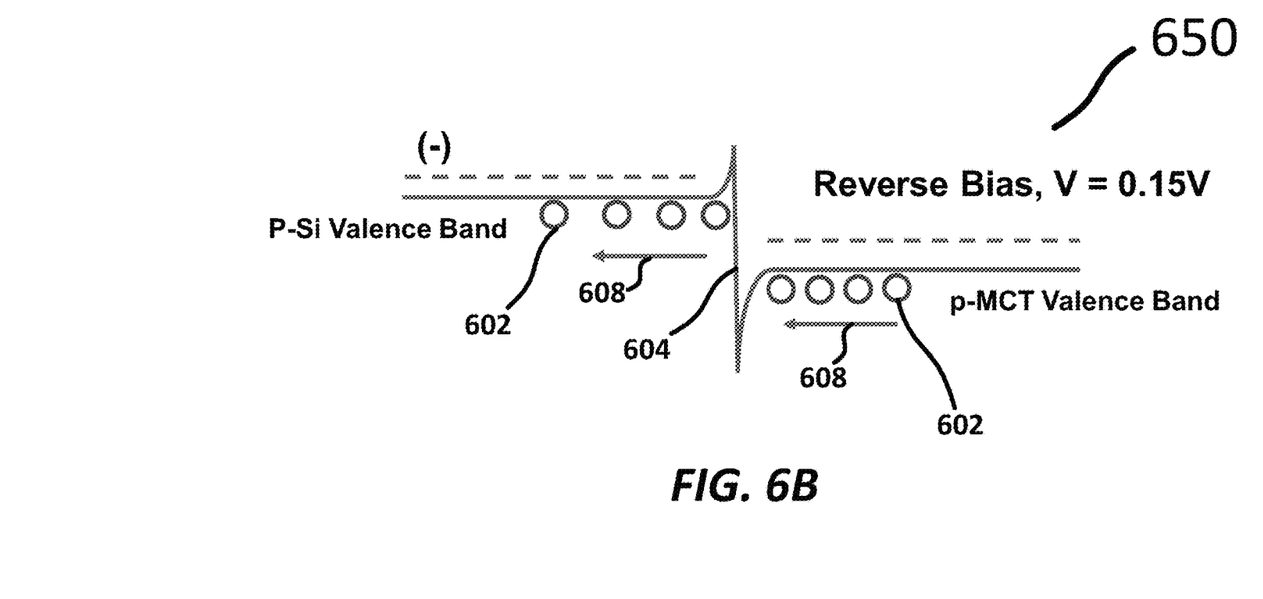
FIG. 6B is a diagram of an example of the valence energy bands of p-MCT and p-Si junction for a reverse bias (e.g., voltage is 0.15V).

Referring to FIG. 6B, a diagram 650 depicts the valence energy bands of p-MCT and p-Si when a reverse bias is applied (e.g., an applied of voltage of −0.15 volts is applied to the silicon side of the junction). Energy bands corresponding to the majority carrier type for the p-MCT and the p-Si form a tunneling junction 604 across which the majority carriers (holes 602) are able to traverse in a direction 608 from right to left in the figure.

The processes described herein are not limited to the specific examples described herein. For example, the processes 200 and 500 are not limited to the specific processing order of FIGS. 2 and 5, respectively. Rather, any of the processing blocks of FIGS. 2 and/or 5 may be re-ordered, combined, or removed, performed in parallel or in serial, as necessary, to achieve the results set forth above. For example, in process 500, processing block 510 may be deleted such that an electrical contact may be formed without a diffusion barrier layer. That is, the metal layer 122 (e.g., aluminum) may be formed directly on the nickel vanadium layer 402.

The techniques described herein are not limited to the specific examples described. For example, the elements of the electrical contact may include more combinations than described herein.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method comprising:
   forming an electrical path between p-type mercury cadmium telluride and a metal layer, the forming of the electrical path comprising:
      depositing a layer of polycrystalline p-type silicon directly on to the p-type mercury cadmium telluride; and
      forming the metal layer on the layer of polycrystalline p-type silicon.

2. The method of claim 1, wherein the forming of the electrical path further comprises forming, on the layer of polycrystalline p-type silicon, a diffusion barrier layer configured to be a barrier to oxygen permeation and metal diffusion,
   wherein forming the metal layer on the layer of polycrystalline p-type silicon comprises depositing a metal directly onto the diffusion barrier layer.

3. The method of claim 1, further comprising:
   doping mercury cadmium telluride with arsenic to a level of about $5 \times 10^{17}$ arsenic atoms per $cm^3$ to form the p-type mercury cadmium telluride; and
   doping a polycrystalline silicon layer with boron to a level of about $3 \times 10^{18}$ boron atoms per $cm^3$ to form the layer of polycrystalline p-type silicon.

4. The method of claim 1, further comprising annealing the p-type mercury cadmium telluride and the layer of polycrystalline p-type silicon during or after forming the metal layer to reduce electrical resistance of the electrical path.

5. The method of claim 4, wherein the metal layer is nickel or a nickel alloy, and
   wherein the annealing causes the nickel or nickel alloy to be consumed in chemical reactions to form nickel silicide.

6. The method of claim 5, wherein a thickness of the nickel or nickel alloy is related to a thickness of the layer of polycrystalline p-type silicon, so that a portion of the layer of polycrystalline p-type silicon remains between the nickel silicide layer and the p-type mercury cadmium telluride.

7. The method of claim 1, further comprising:
   sputtering a nickel vanadium (NiV) layer on to the layer of polycrystalline p-type silicon; and
   annealing, after forming the metal layer, the layer of polycrystalline p-type silicon and the NiV layer to form a nickel silicide layer in direct contact with the layer of polycrystalline p-type silicon,
   wherein the electrical path is gold-free.

8. The method of claim 7, further comprising forming, directly on to the NiV layer, a diffusion barrier layer configured to be a barrier to oxygen permeation and metal diffusion,
   wherein forming the metal layer on the layer of polycrystalline p-type silicon layer comprises forming the metal layer in direct contact with the diffusion barrier layer.

9. The method of claim 7, wherein the nickel silicide layer has vanadium atoms disposed between interstitial sites of nickel and silicon atoms.

10. The method of claim 7, wherein the nickel vanadium is between 3 to 20% by weight of vanadium.

11. An apparatus, comprising:
    an electrical path comprising:
       a p-type mercury cadmium telluride layer;
       a polycrystalline p-type silicon layer in direct contact with the p-type mercury cadmium telluride layer;
       a metal silicide in direct contact with the polycrystalline p-type silicon layer; and
       an electrically conductive metal on the metal silicide,
    wherein, in operation, holes, indicative of electrical current on the electrical path, flow from the p-type mercury cadmium telluride layer to the electrically conductive metal.

12. The apparatus of claim 11, wherein the electrical path further comprises a diffusion barrier layer configured to be a barrier to oxygen permeation and metal diffusion,
    wherein the diffusion barrier layer is in direct contact with the electrically conductive metal and the metal silicide.

13. The apparatus of claim 11, wherein the apparatus is an infrared detector, and
    wherein the electrical path connects an individual pixel of the infrared detector to a corresponding connection of a read-out integrated circuit,
    wherein the infrared detector comprises;
       a p-n junction layer in direct contact with the p-type mercury cadmium telluride layer; and
       a n-type semiconductor in direct contact with the p-n junction layer.

14. The apparatus of claim 11, wherein the polycrystalline p-type silicon layer is doped with a boron atom density greater than $1 \times 10^{18}$ boron atoms per $cm^3$.

15. The apparatus of claim 11, wherein the metal silicide comprises nickel and silicon atoms in about a one-to-one atomic ratio.

16. The apparatus of claim 11, wherein the electrically conductive metal conductive layer comprises one of aluminum, an aluminum alloy, or copper.

17. The apparatus of claim 12, wherein the electrically conductive metal conductive layer and the diffusion barrier layer comprise identical material.

18. A method comprising:
  forming an electrical path between a first semiconductor of a first doping type and a first conductor comprising:
    forming a layer of a second semiconductor of the first doping type onto the first semiconductor; and
    forming a layer of the first conductor on the second semiconductor,
  wherein forming a layer of a second semiconductor of the first doping type onto the first semiconductor comprises forming a layer of polycrystalline p-type silicon on a layer of p-type mercury cadmium telluride.

19. The method of claim 18, wherein, at an interface formed between the first and second semiconductors, the energy bands corresponding to majority carriers of the first and second semiconductors form a junction along the electrical path for which the majority carriers may traverse.

20. The method of claim 18, wherein the electrical path is gold-free.

* * * * *